United States Patent
Kim et al.

(10) Patent No.: US 7,426,000 B2
(45) Date of Patent: Sep. 16, 2008

(54) TRANSISTOR, DISPLAY DEVICE INCLUDING THE SAME, AND MANUFACTURING METHOD THEREOF

(75) Inventors: Sung-Jin Kim, Seongnam-si (KR); Young-Wook Lee, Suwon-si (KR); Keun-Kyu Song, Yongin-si (KR); Mun-Pyo Hong, Seongnam-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 142 days.

(21) Appl. No.: 11/403,292

(22) Filed: Apr. 13, 2006

(65) Prior Publication Data

US 2006/0231957 A1    Oct. 19, 2006

(30) Foreign Application Priority Data

Apr. 14, 2005   (KR) .................. 10-2005-0031057
Apr. 22, 2005   (KR) .................. 10-2005-0033570

(51) Int. Cl.
   *G02F 1/136*   (2006.01)

(52) U.S. Cl. ........................................ 349/43; 257/59
(58) Field of Classification Search .............. 349/43; 257/59, 72
See application file for complete search history.

(56) References Cited

U.S. PATENT DOCUMENTS

| | | | |
|---|---|---|---|
| 6,885,028 B2 * | 4/2005 | Nishiki et al. | 257/59 |
| 2006/0220015 A1 * | 10/2006 | Rho | 257/59 |
| 2006/0226424 A1 * | 10/2006 | Chae et al. | 257/59 |
| 2006/0226425 A1 * | 10/2006 | Chae et al. | 257/59 |
| 2007/0001169 A1 * | 1/2007 | Chae | 257/59 |

* cited by examiner

*Primary Examiner*—James A Dudek
(74) *Attorney, Agent, or Firm*—F. Chau & Associates, LLC

(57) ABSTRACT

A transistor includes a wire formed on a substrate, the wire comprising a semiconductor core, a first cover enclosing a portion of the semiconductor core, and a second cover enclosing the first cover, a first electrode formed on the second cover of the wire, an insulating layer formed on the first electrode and having contact holes exposing portions the semiconductor core, and a second electrode and a third electrode connected to the wire through the contact holes.

20 Claims, 20 Drawing Sheets

FIG.5
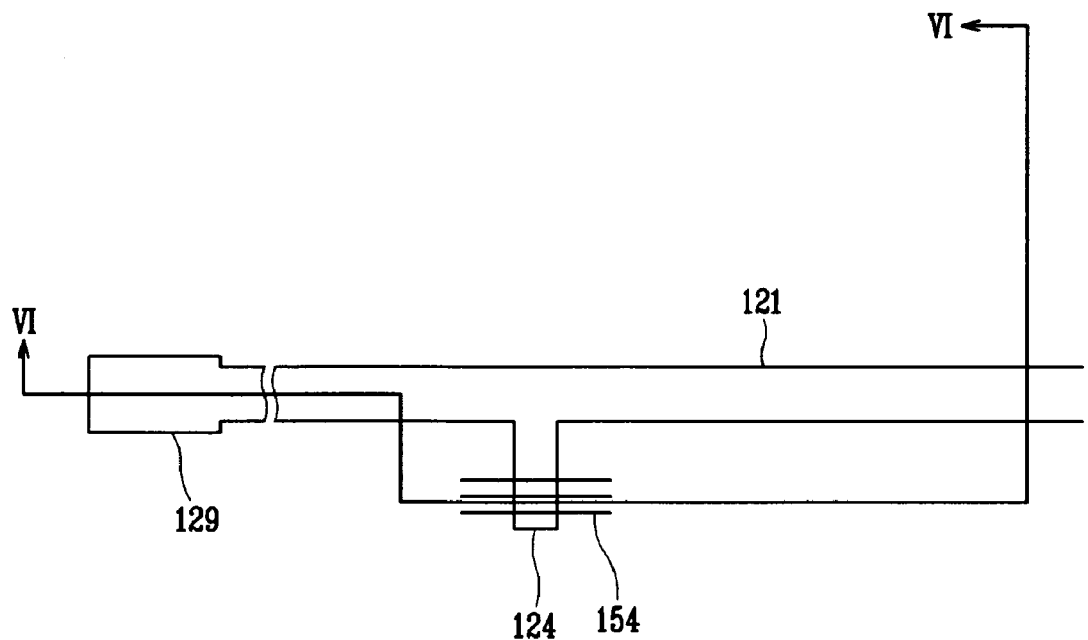
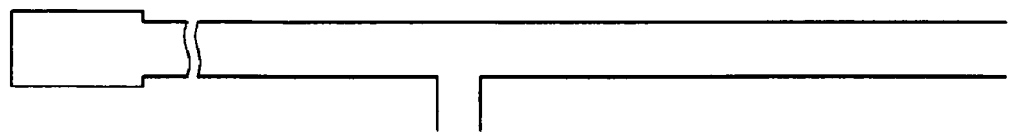

FIG. 7
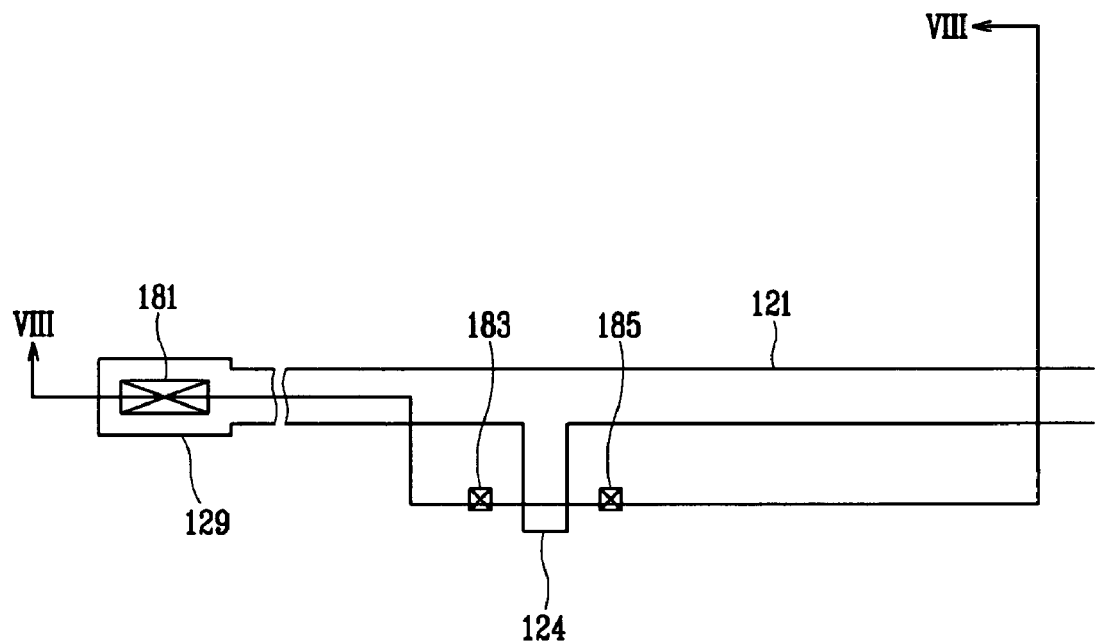

FIG.16
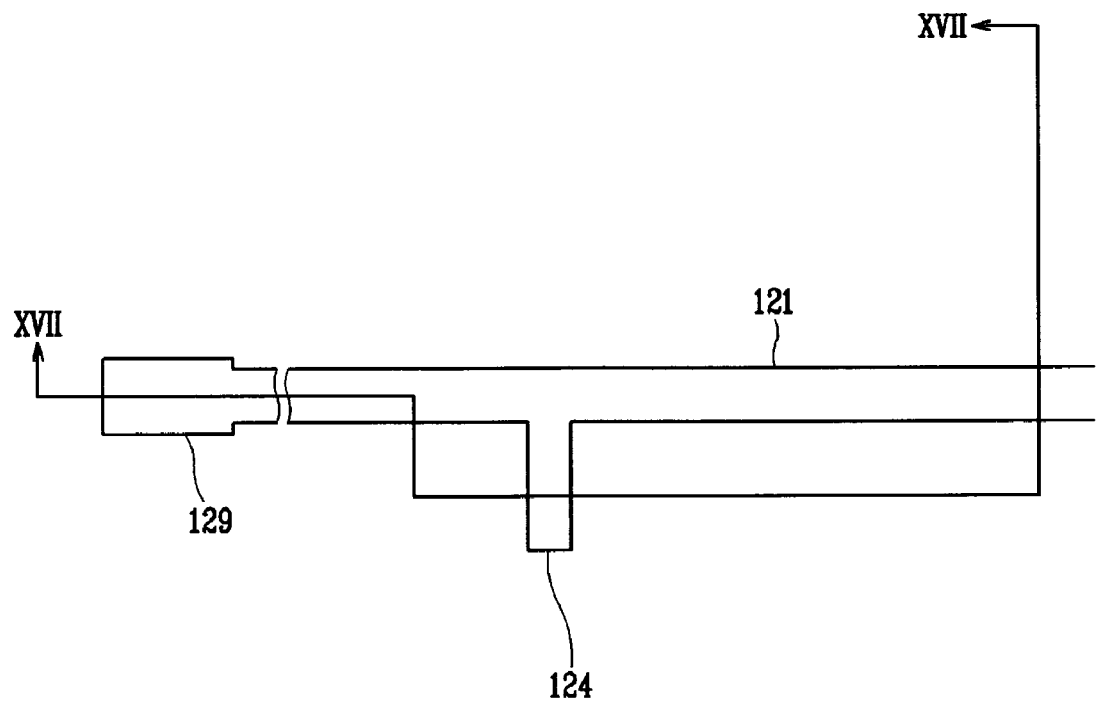
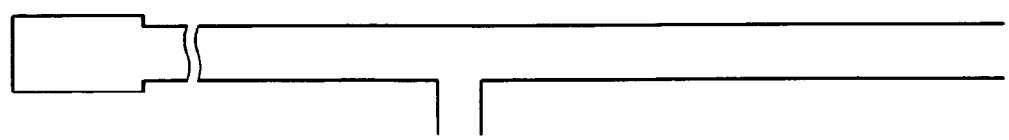

FIG.18
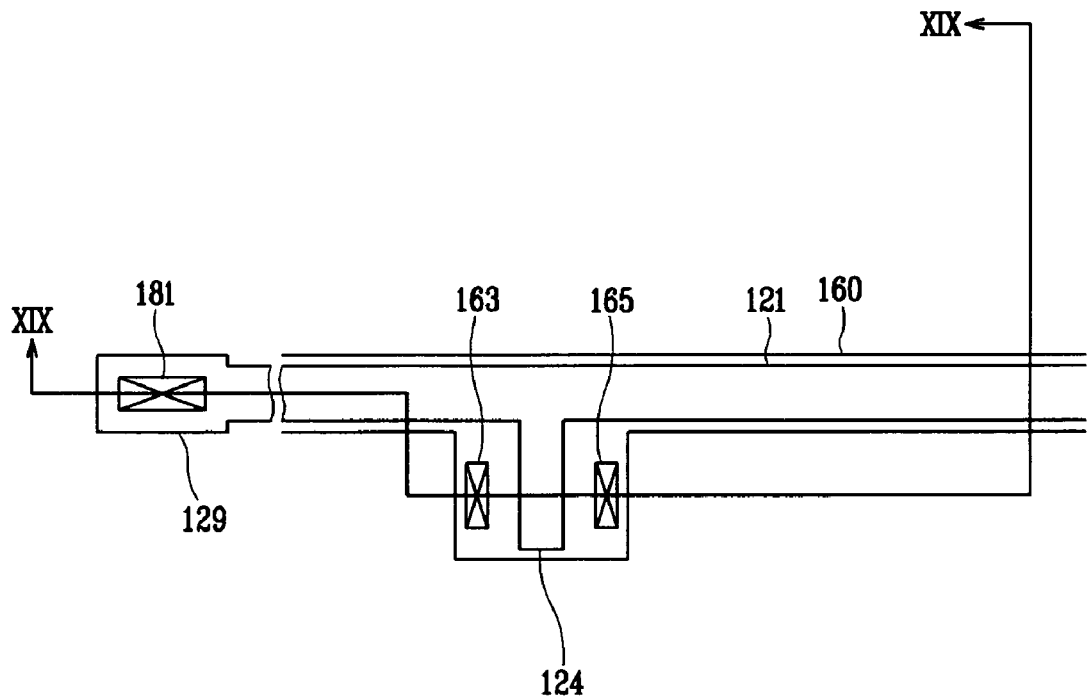

TRANSISTOR, DISPLAY DEVICE INCLUDING THE SAME, AND MANUFACTURING METHOD THEREOF

CROSS-REFERENCE TO RELATED APPLICATIONS

This application claims the benefit of Korean Patent Application No. 2005-0031057, filed on Apr. 14, 2005, and Korean Patent Application No.: 2005-0033570 filed on Apr. 22, 2005 in the Korean Intellectual Property Office, the disclosure of which is incorporated herein by reference in its entirety.

BACKGROUND OF THE INVENTION (a) Field of the Invention

The present invention relates to a transistor, a display device including the same, and a manufacturing method thereof, and more particularly to an amorphous silicon transistor, a display device including the same, and a manufacturing method thereof.

(b) Description of Related Art

Display devices such as liquid crystal displays (LCDs), organic light emitting diode displays (OLED displays), etc. include transistors integrated in a substrate for reducing a size of electrical circuits thereof. Each pixel forming a display area of the display device, as well as driving circuits, includes a transistor. As the size of the transistor becomes small, the aperture ratio of the pixel becomes high to improve an image quality of the display device.

A transistor includes an output electrode, an input electrode, a control electrode, and a semiconductor member. The driving performance of the transistor depends on the characteristics of the semiconductor member.

Silicon may be used for forming the semiconductor member. Silicon may be classified into polysilicon, amorphous silicon, monocrystalline silicon, etc.

Amorphous silicon films can be deposited under low temperature and amorphous silicon transistors are readily used for large display panels. Amorphous silicon has field effect mobility lower than polysilicon and single crystalline silicon.

The polysilicon and single crystalline silicon are made by complicated processes as compared to amorphous silicon.

Therefore, a need exists for a transistor comprising an amorphous silicon transistor and a method for manufacturing the transistor.

SUMMARY OF THE INVENTION

A transistor according to an embodiment of the present invention includes a wire formed on a substrate, the wire comprising a semiconductor core, a first cover enclosing a portion of the semiconductor core, and a second cover enclosing the first cover, a first electrode formed on the second cover of the wire, an insulating layer formed on the first electrode and having contact holes exposing portions the semiconductor core, and a second electrode and a third electrode connected to the wire through the contact holes.

A display device according to an embodiment of the present invention includes a substrate, a wire formed on a substrate, the wire comprising a semiconductor core, an inner cover enclosing a portion of the semiconductor core, and an outer cover enclosing the inner cover, a first electrode formed on the outer cover of the wire, an insulating layer formed on the first electrode and having contact holes exposing portions the semiconductor core; and a second electrode and a third electrode connected to the wire through the contact holes, and a pixel electrode connected to the third electrode. The display device may further include a common electrode facing the pixel electrode; and a liquid crystal layer disposed between the pixel electrode and the common electrode.

In the above-described transistor and the display device, insulating layer may include organic material such as acrylic copolymer. The first electrode, the first cover (or the inner cover), and the second cover (or the outer cover) may have substantially coinciding boundaries.

A transistor according to another embodiment of the present invention includes a first electrode, a second electrode, and a third electrode formed on a substrate, a wire comprising a semiconductor core formed on the first electrode, a first cover enclosing the semiconductor core, and a second cover enclosing the first cover, and a fixer formed on the first electrode and the wire, wherein portions of the semiconductor core are not covered with the fixer and are connected to the second and the third electrodes.

A display device according to another embodiment of the present invention includes a first electrode, a second electrode, and a third electrode formed on a substrate, a wire comprising a semiconductor core formed on the first electrode, an inner cover enclosing the semiconductor core, and an outer cover enclosing the inner cover, a fixer formed on the first electrode and the wire, and a pixel electrode connected to the third electrode, wherein portions of the semiconductor core are not covered with the fixer and are connected to the second and the third electrodes. The display device may further include a common electrode facing the pixel electrode, and a liquid crystal layer disposed between the pixel electrode and the common electrode.

In the above-described transistor and the display device, the semiconductor core may have opposite end portions that are not covered with the fixer. At least one portion of the second and the third electrodes may be disposed on the fixer. The second and the third electrodes may have boundaries contacting the semiconductor core.

In above-described embodiments, the first cover or the inner cover may include an insulator such as silicon oxide or silicon nitride. The second cover may include a conductor such as Al, Cr, Mo, Cu, Ti, and Ta.

A method of manufacturing a display device according to an embodiment of the present invention includes spreading a wire on a substrate, the wire comprising a semiconductor core, an inner cover enclosing the semiconductor core, and an outer cover enclosing the inner cover, forming a gate line including a gate electrode, the gate electrode overlapping the wire, removing portions of the outer cover and the inner cover to expose portions of the semiconductor core, forming an insulating layer having contact holes, the contact holes exposing the exposed portions of the semiconductor core, forming a data line and an output electrode connected to the wire through the contact holes, and forming a pixel electrode connected to the output electrode.

The insulating layer may include organic material such as acrylic copolymer.

A method of manufacturing a display device according to another embodiment of the present invention includes forming a gate line including a gate electrode on a substrate, spreading a wire on a substrate, each of the wires comprising a semiconductor core, an inner cover enclosing the semiconductor core, and an outer cover enclosing the inner cover, forming a fixer having contact holes, the contact holes exposing portions of the wire, removing exposed portions of the outer covers and the inner covers of the wire to expose portions of the semiconductor core, forming a data line and an output electrode connected to the wire through the contact holes, and forming a pixel electrode connected to the output electrode.

The method may further include removing a wire not fixed by the fixer.

In above-described methods, the gate line may be formed by wet etch and the removal of portions of the outer cover and the inner cover may include wet etching the outer cover, and wet or dry etching the inner cover. The spreading of the wire may include forming a mixture including the wire and ethanol.

BRIEF DESCRIPTION OF THE DRAWINGS

The present invention will become more apparent by describing embodiments thereof in detail with reference to the accompanying drawings, in which:

FIG. 5 is a layout view of the wire transistor array panel for an LCD shown FIGS. 1 and 3 in an intermediate step of a manufacturing method thereof according to an embodiment of the present invention;

FIG. 7 is a layout view of the wire transistor array panel shown FIGS. 1 and 3 in the step following the step shown in FIG. 5;

FIG. 16 is a layout view of the wire transistor array panel for an LCD shown FIGS. 11 and 13 in an intermediate step of a manufacturing method thereof according to an embodiment of the present invention;

FIG. 18 is a layout view of the wire transistor array panel shown FIGS. 11 and 13 in the step following the step shown in FIG. 16;

DETAILED DESCRIPTION OF PREFERRED EMBODIMENTS

An LCD as an example of a display device according to an embodiment of the present invention will be described in detail with reference to FIGS. 1, 2, 3 and 4.

Figure 1:
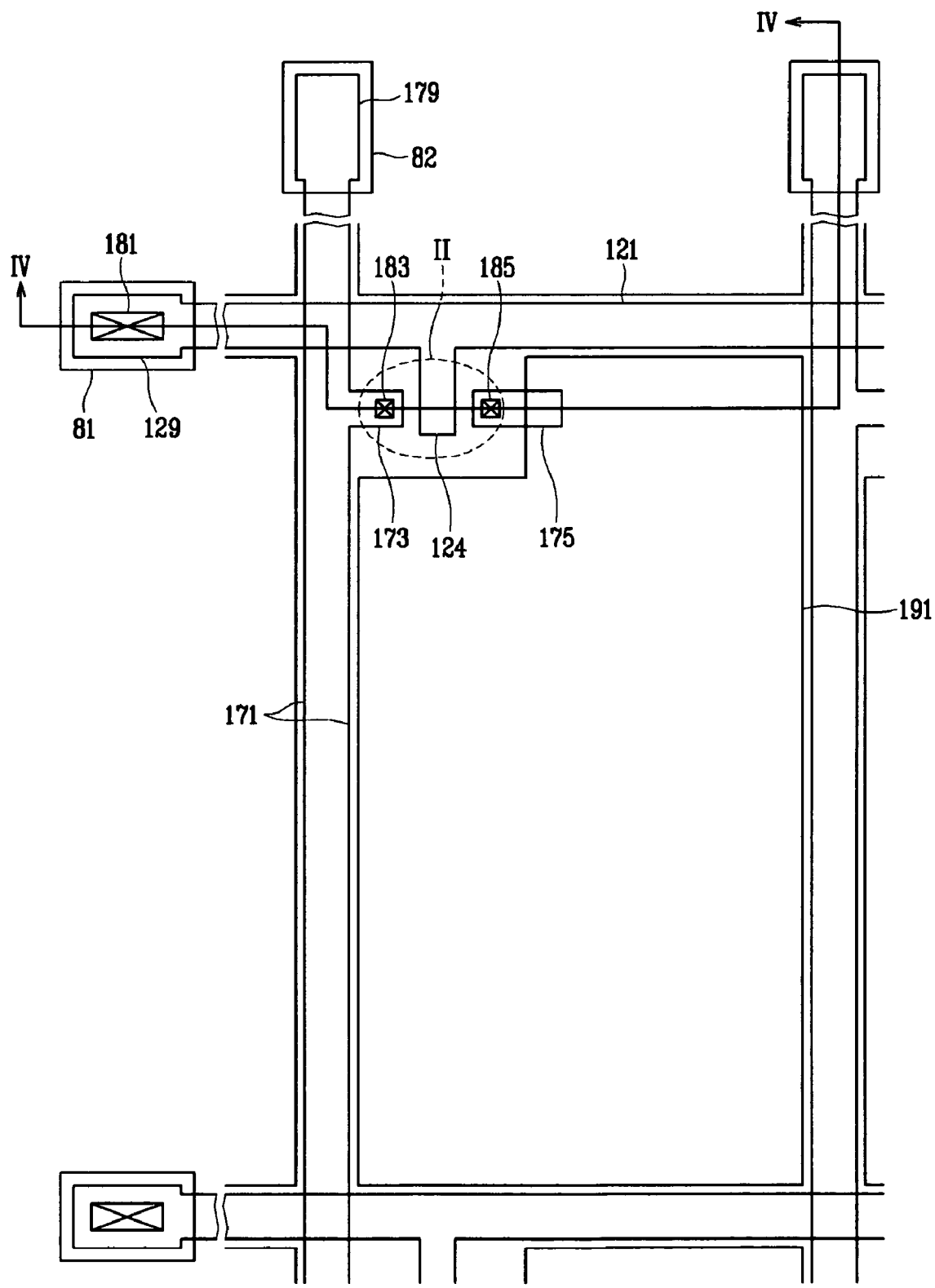
FIG. 1 is a layout view of a wire transistor array panel according to an embodiment of the present invention.
Figure 2:
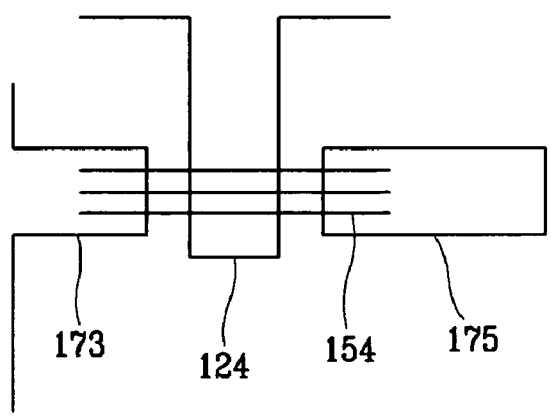
FIG. 2 is an expanded view of a portion of the wire transistor array panel shown in FIG. 1.
Figure 3:
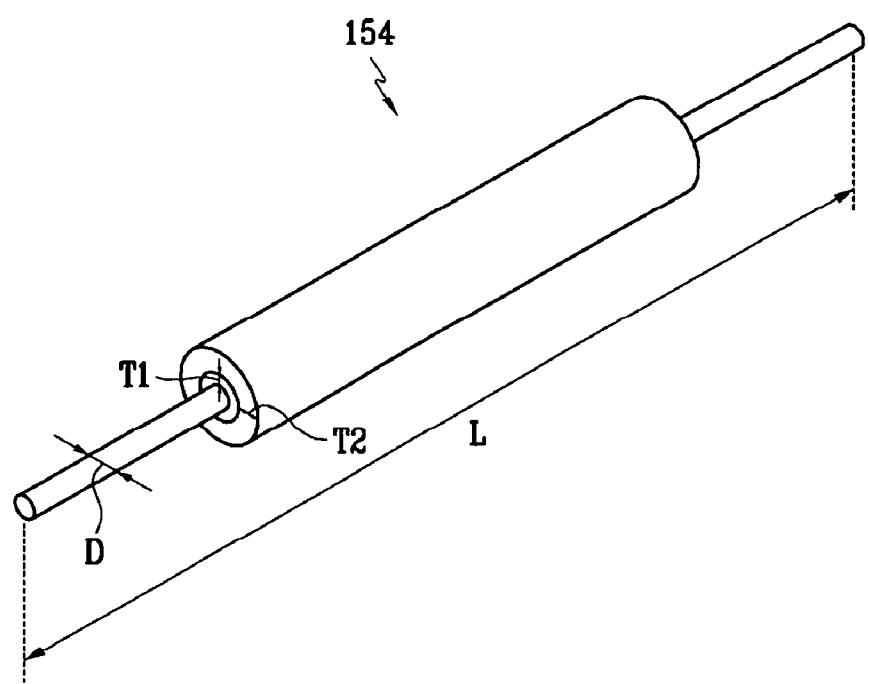
FIG. 3 is a perspective view of a wire shown in FIG. 2.
Figure 4:
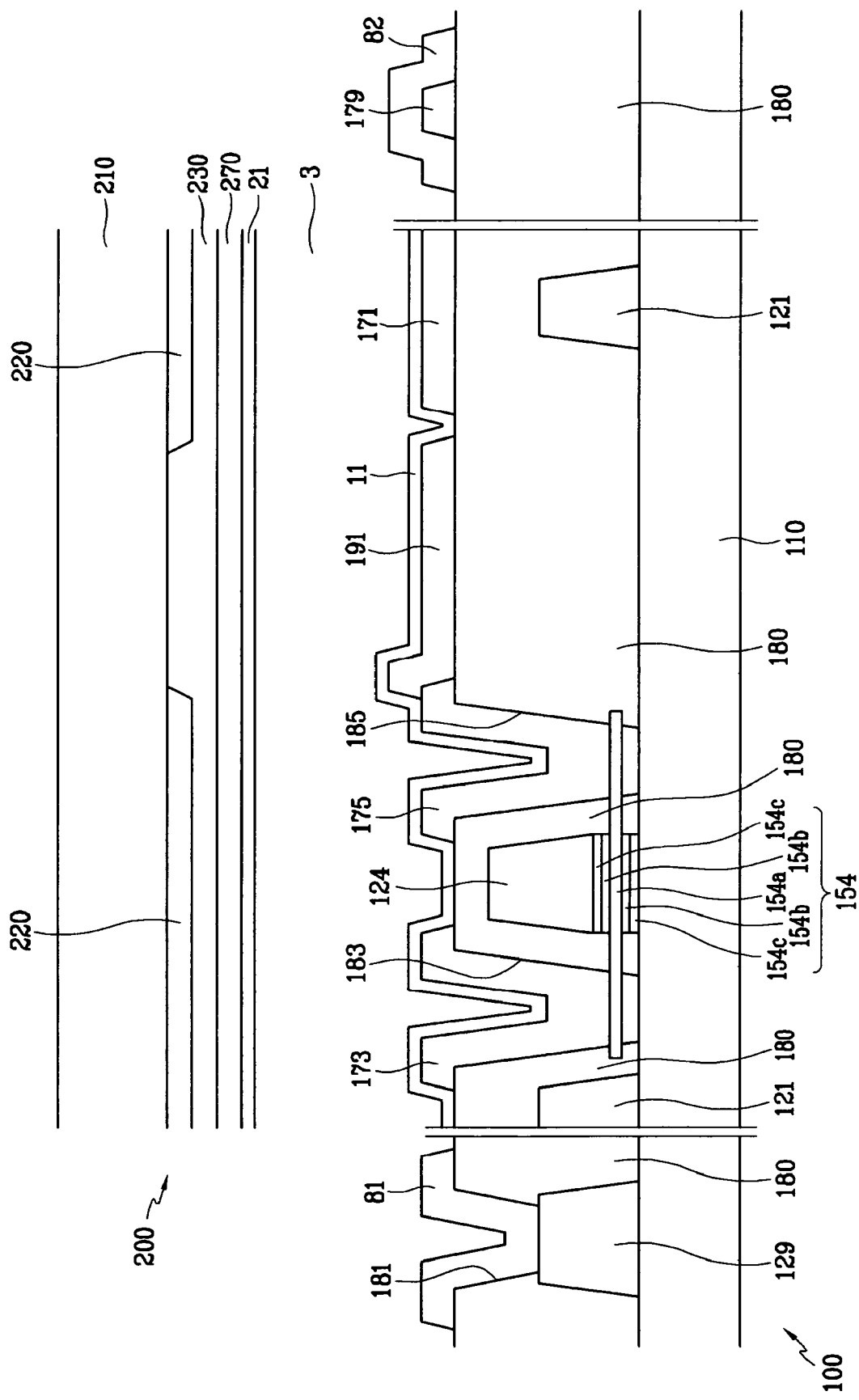
FIG. 4 is a sectional view of an LCD including the wire transistor array panel shown in FIG. 1 taken along line IV-IV.

FIG. 1 is a layout view of a wire transistor array panel according to an embodiment of the present invention, FIG. 2 is an expanded view of a portion of the wire transistor array panel shown in FIG. 1, FIG. 3 is a perspective view of a wire shown in FIG. 2, and FIG. 4 is a sectional view of an LCD including the wire transistor array panel shown in FIG. 1 taken along line IV-IV.

Referring to FIGS. 1-4, an LCD according to an embodiment of the present invention includes a wire transistor array panel 100, a common electrode panel 200 facing the wire transistor array panel 100, and a liquid crystal layer 3 interposed between the panels 100 and 200.

The common electrode panel 200 comprises a light blocking member 220, referred to as a black matrix, formed on an insulating substrate 210 such as transparent glass or plastic. The light blocking member 220 may have a single-layer structure including Cr (Chromium), or a dual-layered structure including Cr and Cr oxide. Otherwise, the light blocking member 220 may include an organic layer including black pigment.

A plurality of color filters 230 are also formed on the substrate 210. The color filters 230 may represent one of the primary colors such as red, green and blue colors. Adjacent color filters 230 may overlap each other.

A common electrode 270 is formed on the color filters 230. The common electrode 270 may be made of transparent conductive material such as indium tin oxide (ITO) and indium zinc oxide (IZO).

An overcoat (not shown) may be formed between the color filters 230 and the common electrode 270. The overcoat substantially prevents the color filters 230 from being exposed and provides a flat surface.

The wire transistor panel 100 comprises a plurality of wires 154 formed on an insulating substrate 110 such as transparent glass or plastic.

Referring to FIG. 2, the wires 154 are arranged substantially parallel to each other in a two-dimensional plane. However, the wires 154 may be arranged randomly rather than parallel to each other or may be laminated in a three-dimensional space.

Referring to FIGS. 3 and 4, each of the wires 154 includes a semiconductor core 154a, an inner cover 154b, and an outer cover 154c. The semiconductor core 154a may be made of single crystalline semiconductor. The inner cover 154b covers the semiconductor core 154a, and the outer cover 154c covers the inner cover 154b. The outer cover 154c and the inner cover 154b enclose a center portion of the semiconductor core 154a and end portions of the semiconductor core 154a are exposed.

Material for the semiconductor core 154a includes any semiconductor that can be made to have a nanometer size, such that the wire may be a nanowire. Examples of the material for the semiconductor core 154a include Si (Silicon), Ge (Germanium), and III-V compound semiconductor. The semiconductor core 154a is lightly doped with conductive impurity ions including P type impurity such as B (Boron), Ga (Gallium), etc., and N type impurity such as P (Phosphorus), As (Arsenic), etc. The semiconductor core 154a has a diameter D equal to about 18-22 nm and a length L equal to about 30-35 microns.

The inner cover 154b may be made of silicon oxide $SiO_2$ or silicon nitride SiNx, and the outer cover 154c may be made of conductive material such as Al (Aluminum), Cr, Mo (Molybdenum), Cu (Copper), Ti (Titanium), Ta (Tantalum), etc. Each of the thickness T1 of the inner cover 154b and the thickness T2 of the outer cover 154c may be equal to about 20-25 nm.

A plurality of gate lines 121 are also formed on the substrate 110.

The gate lines 121 transmit gate signals and extend substantially in a transverse direction. Each of the gate lines 121 includes a plurality of gate electrodes 124 projecting downward to overlap the wires 154 and an end portion 129 having an area for contact with another layer or an external driving circuit. The gate electrodes 124 are disposed on the outer covers 154c of the wires 154. The gate electrodes 124 have boundaries substantially coinciding with boundaries the inner covers 154b and the outer covers 154c of the wires 154, and are separated apart from the semiconductor cores 154a. The gate lines 121 may extend to be connected to a driving circuit that may be integrated on the substrate 110.

The gate lines 121 and the storage electrode lines 131 are preferably made of Al containing metal such as Al and Al alloy, Ag containing metal such as Ag and Ag alloy, Cu containing metal such as Cu and Cu alloy, Mo containing metal such as Mo and Mo alloy, Cr, Ta, or Ti. The gate lines 121 and the storage electrode lines 131 may have a multi-layered structure including two conductive films (not shown) having different physical characteristics. One of the two films is preferably made of low resistivity metal including Al containing metal, Ag containing metal, and Cu containing metal for reducing signal delay or voltage drop. The other film is preferably made of material such as Mo containing metal, Cr, Ta, or Ti, which has good physical, chemical, and electrical contact characteristics with other materials such as indium tin oxide (ITO) or indium zinc oxide (IZO). Examples of the combination of the two films are a lower Cr film and an upper Al (alloy) film and a lower Al (alloy) film and an upper Mo (alloy) film. The gate lines 121 and the storage electrode lines 131 may be made of various other metals or conductors.

The lateral sides of the gate lines 121 are inclined relative to a surface of the substrate 110, and an inclination angle thereof ranges between about 30-80 degrees.

An insulating layer 180 is formed on the wires 154 and the gate lines 121. The insulating layer 180 may be made of organic material such as acrylic copolymers and may have a thickness of about 3.5-4.5 microns. The insulating layer 180 may be made of inorganic material such as silicon nitride or silicon oxide, or low dielectric insulator. The low dielectric insulator may have a dielectric constant equal to or less than about 4.0. Examples of the low dielectric insulator may include a-Si:C:O and a-Si:O:F formed by plasma enhanced chemical vapor deposition (PECVD). The organic material for the insulating layer 180 may have photosensitivity. The insulating layer 180 may have a flat top surface. The insulating layer 180 may include a lower film of inorganic insulator and an upper film of organic insulator such that it takes the insulating characteristics of the organic insulator while preventing the exposed portions of the semiconductor cores 154a from being damaged by the organic insulator.

The insulating layer 180 has a plurality of contact holes 181 exposing the end portions 129 of the gate lines 121 and a plurality of contact holes 183 and 185 exposing the exposed portions of the semiconductor cores 154a. Both ends of the wires 154 may be exposed.

A plurality of data lines 171 and a plurality of drain electrodes 175 are formed on the insulating layer 180.

The data lines 171 transmit data signals and extend substantially in the longitudinal direction to intersect the gate lines 121. Each data line 171 includes a plurality of source electrodes 173 connected to the semiconductor cores 154a through the contact holes 183 and an end portion 179 having a large area for contact with another layer or an external driving circuit. The data lines 171 may extend to be connected to a driving circuit that may be integrated on the substrate 110.

The drain electrodes 175 are separated from the data lines 171 and connected to the semiconductor cores 154a through the contact holes 185.

A gate electrode 124, a source electrode 173, and a drain electrode 175 along with at least one wire 154 form a transistor having a channel formed in the semiconductor core 154a disposed interior to the inner cover 154b of the wire 154.

The data lines 171 and the drain electrodes 175 are preferably made of refractory metal such as Cr, Mo, Ta, Ti, or alloys thereof. The data lines 171 and the drain electrodes 175 may have a multilayered structure including a refractory metal film (not shown) and a low resistivity film (not shown). Examples of the multi-layered structure are a double-layered structure including a lower Cr/Mo (alloy) film and an upper Al (alloy) film and a triple-layered structure of a lower Mo (alloy) film, an intermediate Al (alloy) film, and an upper Mo (alloy) film. The data lines 171 and the drain electrodes 175 may be made of various other metals or conductors.

The data lines 171 and the drain electrodes 175 have inclined edge profiles, and an inclination angles thereof range between about 30-80 degrees.

A protection layer (not shown) for protecting the data lines 171 and the drain electrodes 175 may be formed on the insulating layer 180. The protection layer may be made of the same material as the insulating layer 180.

A plurality of pixel electrodes 191 and a plurality of contact assistants 81 and 82 are also formed on the insulating layer 180. The plurality of pixel electrodes 191 and the plurality of contact assistants 81 and 82 are preferably made of transparent conductor such as ITO or IZO or reflective conductor such as Ag, Al, Cr, or alloys thereof.

The pixel electrodes 191 contact the drain electrodes 175 through the contact holes 185 such that the pixel electrodes 191 receive data voltages from the drain electrodes 175. The pixel electrodes 191 supplied with the data voltages generate electric fields in cooperation with a common electrode 270 of the common electrode panel 200 supplied with a common voltage, which determine the orientations of the liquid crystal layer 3 disposed between the pixel electrode 191 and the common electrode 270. A pixel electrode 191 and the common electrode 270 form a capacitor, and more particularly, a liquid crystal capacitor, which stores applied voltages after the wire transistor turns off.

Another capacitor, a storage capacitor, for enhancing the voltage storing capacity of the liquid crystal capacitor may be additionally provided in parallel to the liquid crystal capacitor. The storage capacitor may be formed by overlapping a pixel electrode 191 and a gate line 121 adjacent thereto. The capacitance of the storage capacitor can be increased by providing a projection at the previous gate line to increase overlapping areas. Otherwise, the storage capacitor may be formed by an overlap of a pixel electrode 191 and a separately provided signal line, e.g., a storage electrode line.

Alignment layers 11 and 21, that may be homeotropic or homogeneous, are coated on inner surfaces of the panels 100 and 200, and polarizers (not shown) are provided on outer surfaces of the panels 100 and 200 so that polarization axes thereof may be crossed or parallel to each other. One of the polarizers may be omitted when the LCD is a reflective LCD.

The LCD may further include at least one retardation film (not shown) for compensating the retardation of the LC layer 3. The retardation film has birefringence and reversely compensates for the birefringence of the liquid crystal layer 3. The retardation film may include uniaxial or biaxial optical film. In particular, negative uniaxial optical film may be preferred.

A plurality of spacers (not shown) are disposed between the wire transistor panel 100 and the common electrode panel 200. The spacers may be made of insulating material and keeps a gap between the panels 100 and 200 substantially constant.

The LCD may further include a backlight unit (not shown) supplying light to the LC layer 3 through the polarizers, the retardation film, and the panels 100 and 200.

The liquid crystal layer 3 may be aligned in a vertical alignment (VA) mode or in a twisted nematic (TN) mode. Otherwise, the liquid crystal layer 3 may include liquid crystal molecules having bend or splay alignment that is symmetrical with respect to a midplane between the substrates 110 and 210.

As described above, a wire transistor includes single crystalline wires.

In addition, the wire transistors may be included in a gate driver or a data driver such that the drivers are integrated in the panel 100.

A method of manufacturing the wire transistor array panel shown in FIGS. 1-4 according to an embodiment of the present invention will be described in detail with reference to FIGS. 5-10 as well as FIGS. 1-4.

Figure 6:
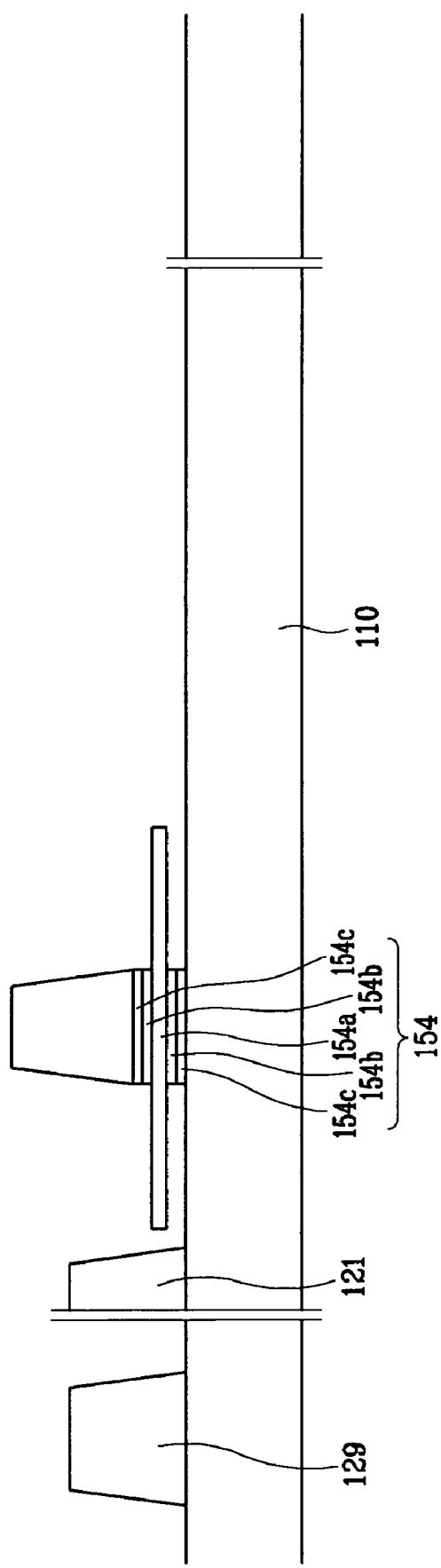
FIG. 6 is a sectional view of the wire transistor array panel shown in FIG. 5 taken along line VI-VI.
Figure 8:
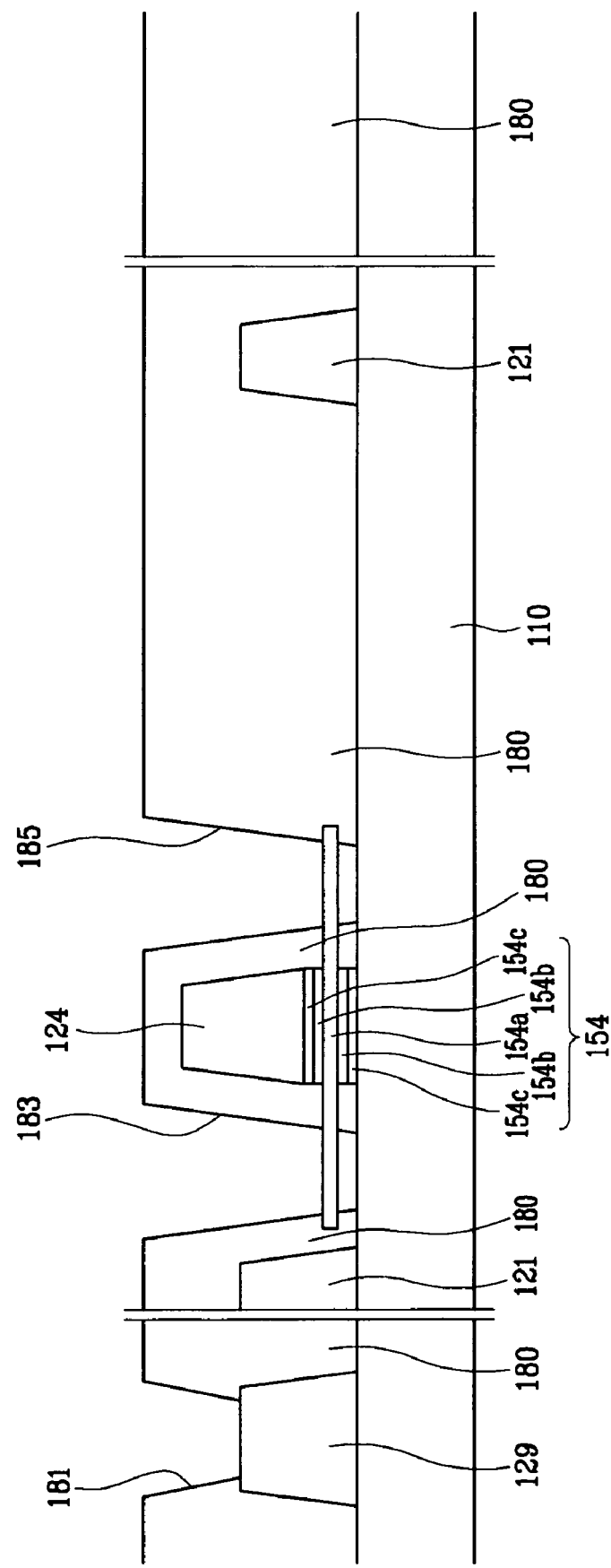
FIG. 8 is a sectional view of the wire transistor array panel shown in FIG. 7 taken along line VIII-VIII.
Figure 9:
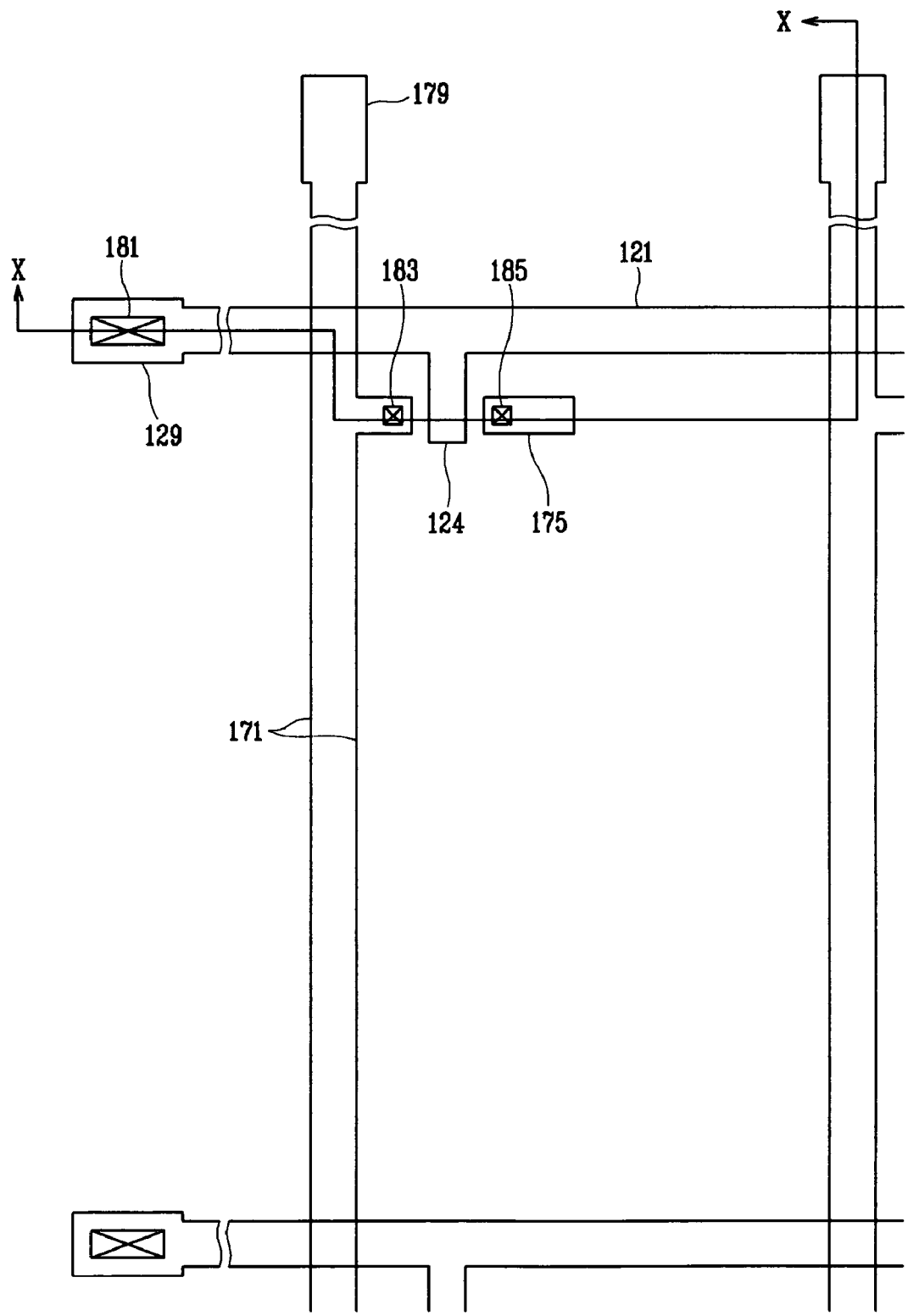
FIG. 9 is a layout view of the wire transistor array panel shown FIGS. 1 and 3 in the step following the step shown in FIG. 7.
Figure 10:
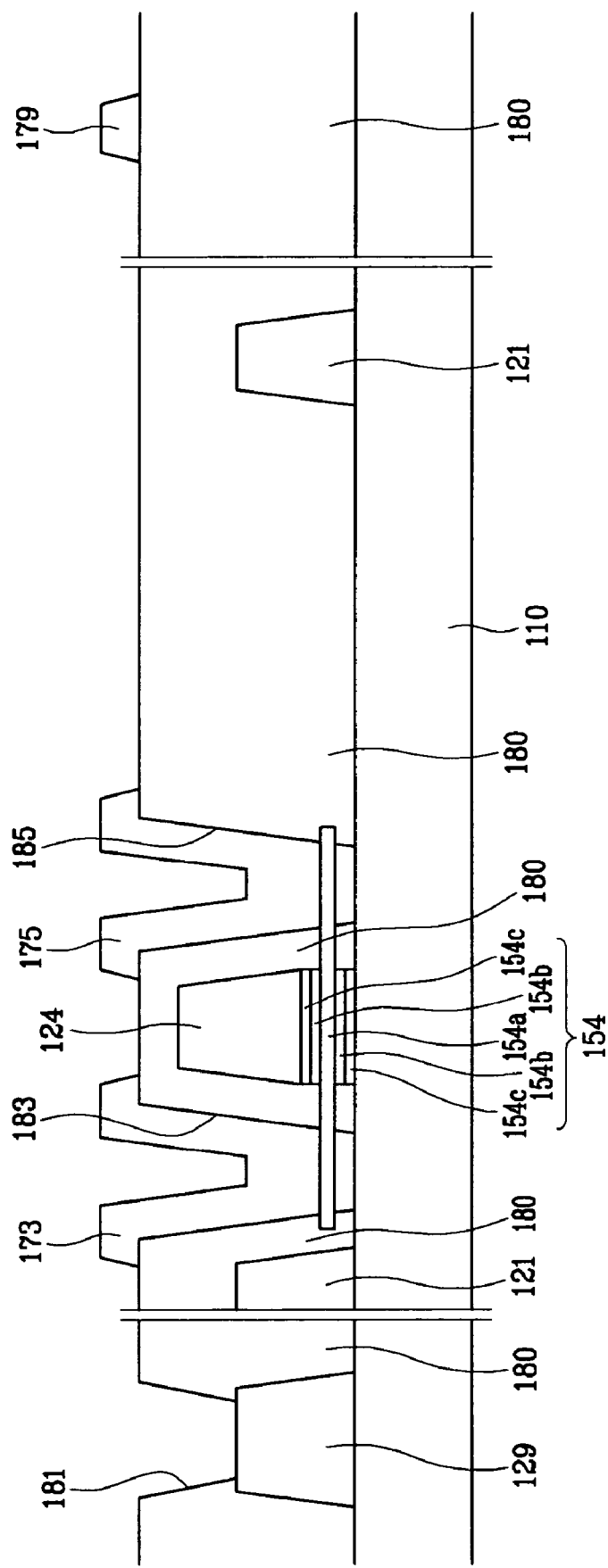
FIG. 10 is a sectional view of the wire transistor array panel shown in FIG. 9 taken along line X-X.

FIG. 5 is a layout view of the wire transistor array panel for an LCD shown FIGS. 1 and 3 in an intermediate step of a manufacturing method thereof according to an embodiment of the present invention. FIG. 6 is a sectional view of the wire transistor array panel shown in FIG. 5 taken along lines VI-VI. FIG. 7 is a layout view of the wire transistor array panel shown FIGS. 1 and 3 in the step following the step shown in FIG. 5. FIG. 8 is a sectional view of the wire transistor array panel shown in FIG. 7 taken along lines VIII-VIII. FIG. 9 is a layout view of the wire transistor array panel shown FIGS. 1 and 3 in the step following the step shown in FIG. 7. FIG. 10 is a sectional view of the wire transistor array panel shown in FIG. 9 taken along lines X-X.

Referring to FIGS. 5 and 6, wires 154 including semiconductor cores 154a covered with inner covers 154b and outer covers 154c are spread on a transparent insulating substrate 110. The wires 154 may be put into liquid such as ethanol or photoresist to form a mixture and the mixture may be coated on the substrate 110.

Examples of the coating method include gravure coating, meyer rod coating, doctor blade coating, spin coating, slit coating, and inkjet print. The mixture including the wires 154 may be flowed in a predetermined direction on the substrate 110 or a mold having trenches that can receive the wires 154 may be formed before the mixture coating, such that the wires 154 are substantially aligned in a direction.

When using ethanol ethanol is evaporated after the coating and the wires 154 remain on the substrate 110.

A conductive layer is deposited by sputtering, etc., and patterned by photolithography and etching to form a plurality of gate lines 121 including gate electrodes 124 and end portions 129. Some of the wires 154 spaced apart from the gate lines 121 are fully exposed, and others of the wires 154 are partly exposed, being partially covered with the gate lines 121.

The fully exposed wires 154 are removed from the substrate 110. Portions of the outer covers 154c and the inner covers 154b of the partly exposed wires 154 are etched to expose portions of the semiconductor core 154a. The gate lines 121 and the outer covers 154c may be wet etched and the inner covers 154b may be dry or wet etched. Bottom portions of the inner covers 154b and the outer covers 154c disposed near the surface of the substrate 110 may not be removed.

In this way, both end portions of some of the spread wires 154 are exposed as shown in FIG. 2B.

Referring to FIGS. 7 and 8, an organic insulating layer 180 is deposited by spin coating, etc. A plurality of contact holes 183 and 185 are formed at the insulating layer 180 by photolithography (and etch) to expose portions of the semiconductor cores 154a of the wires 154.

Referring to FIGS. 9 and 10, a conductive layer is deposited by sputtering, etc. The conductive layer is patterned by photolithography and etching to form a plurality of data lines 171 and a plurality of drain electrodes 175. The data lines 171 and the drain electrodes 175 are connected to opposite ends of the wires 154 through the contact holes 183 and 185, respectively.

ITO or IZO is deposited and patterned by photolithography and etching to form a plurality of pixel electrodes 191 and a plurality of contact assistants 81 and 82 as shown in FIGS. 1 and 4. A wire transistor array panel according to another embodiment of the present invention will be described in detail with reference to FIGS. 11-15.

Figure 11:
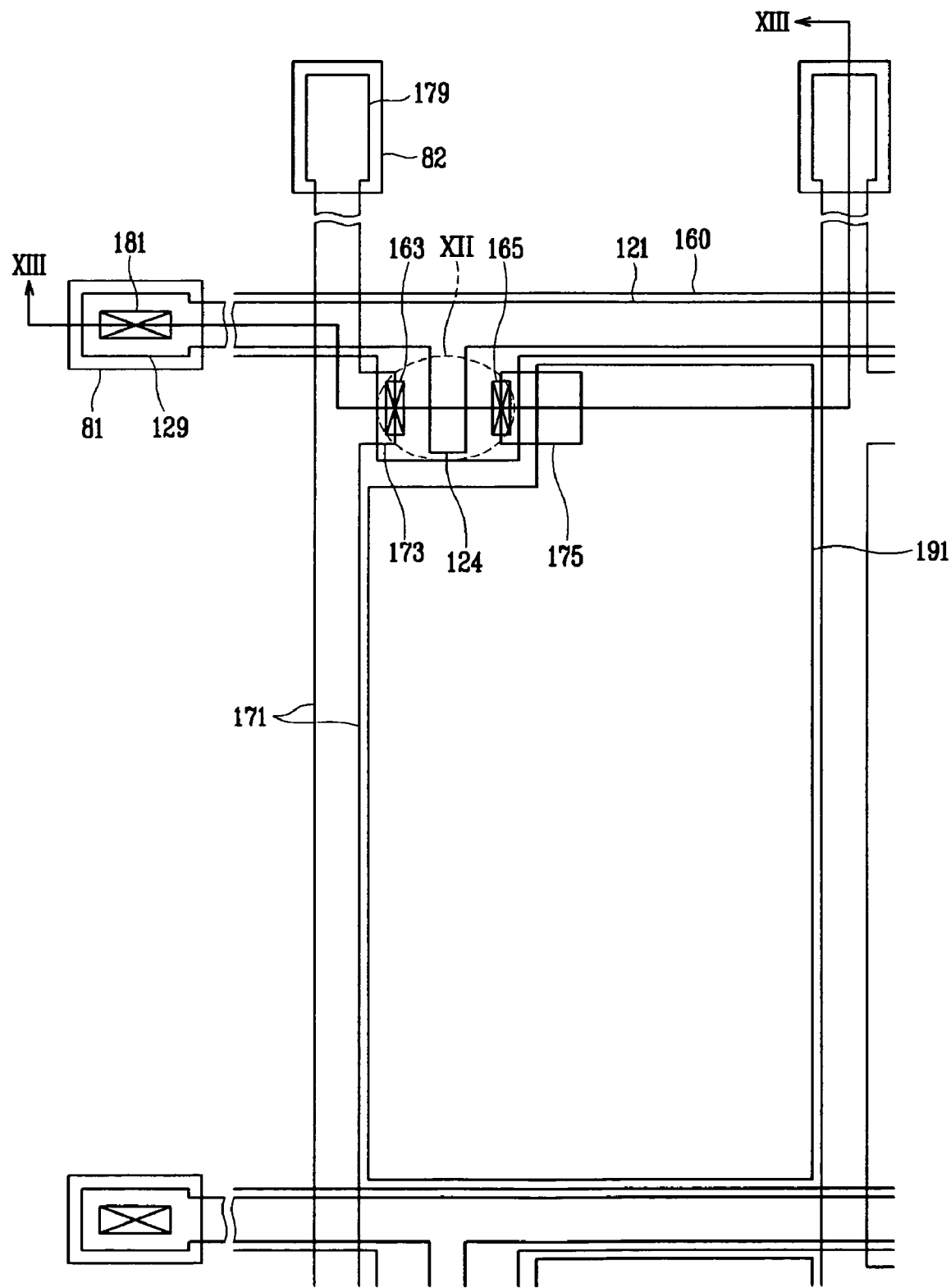
FIG. 11 is a layout view of a wire transistor array panel according to another embodiment of the present invention.
Figure 12:
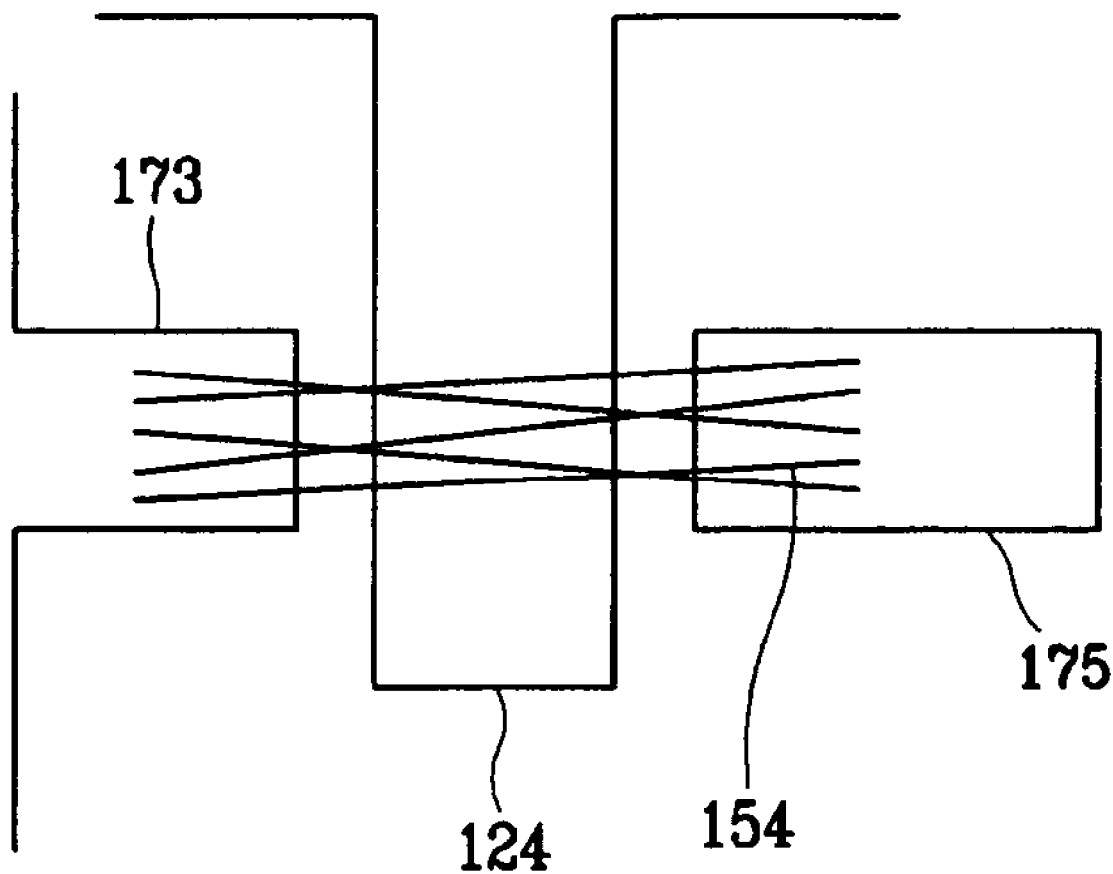
FIG. 12 is an expanded view of a portion of the wire transistor array panel shown in FIG. 11.
Figure 13:
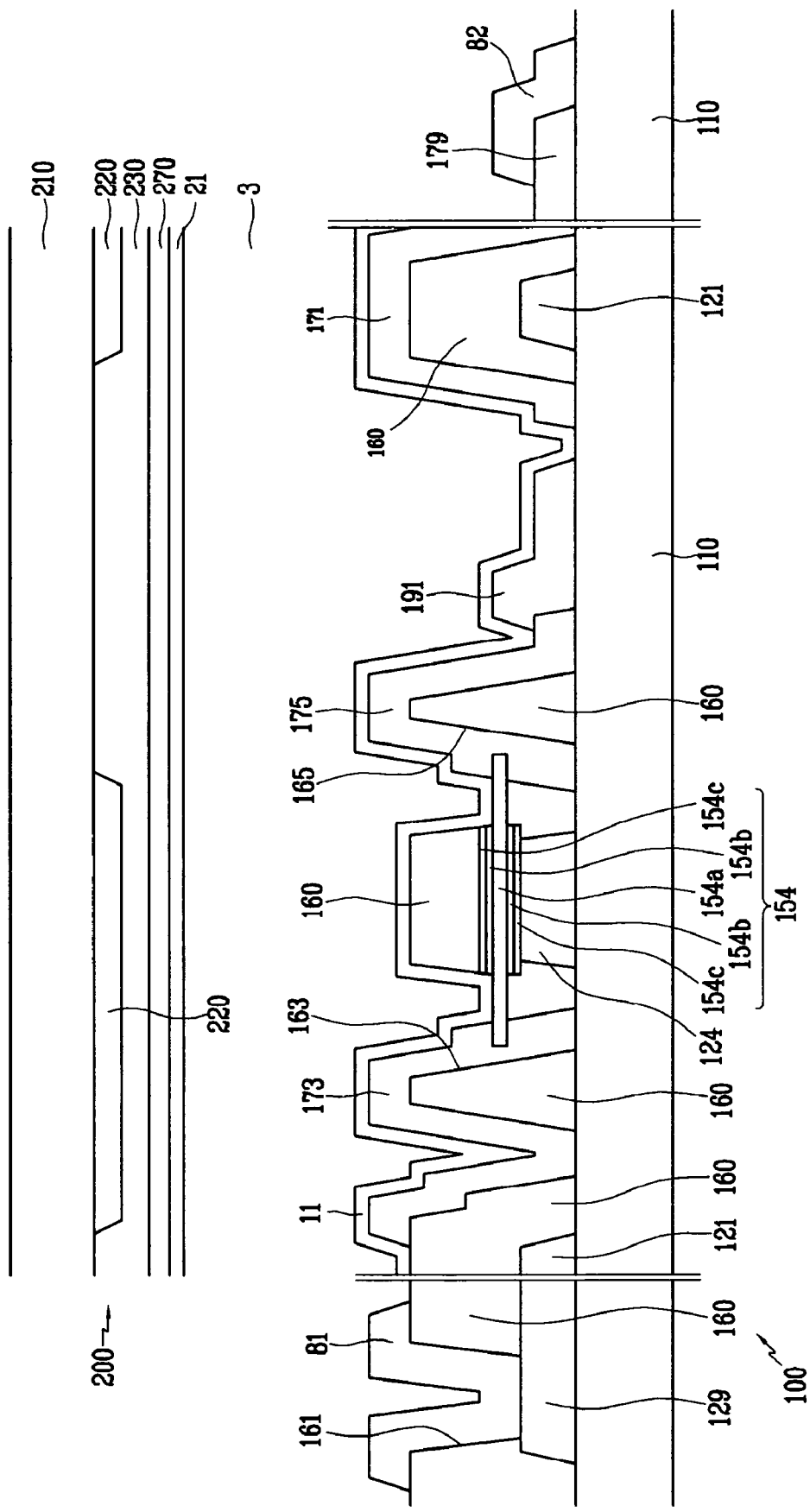
FIG. 13 is a sectional view of an LCD including the wire transistor array panel shown in FIG. 11 taken along line XIII-XIII.
Figure 14:
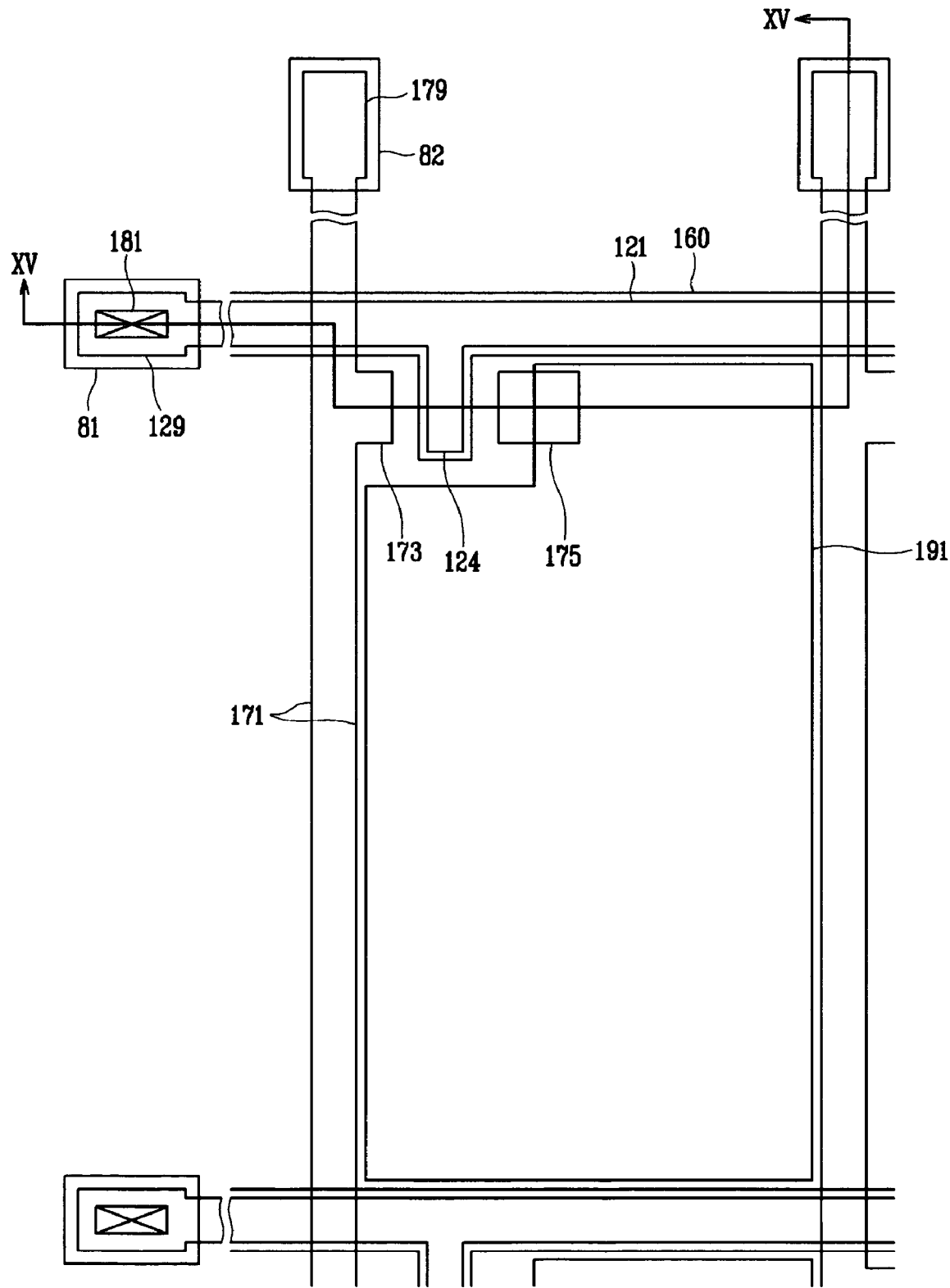
FIG. 14 is a layout view of a wire transistor array panel according to another embodiment of the present invention.
Figure 15:
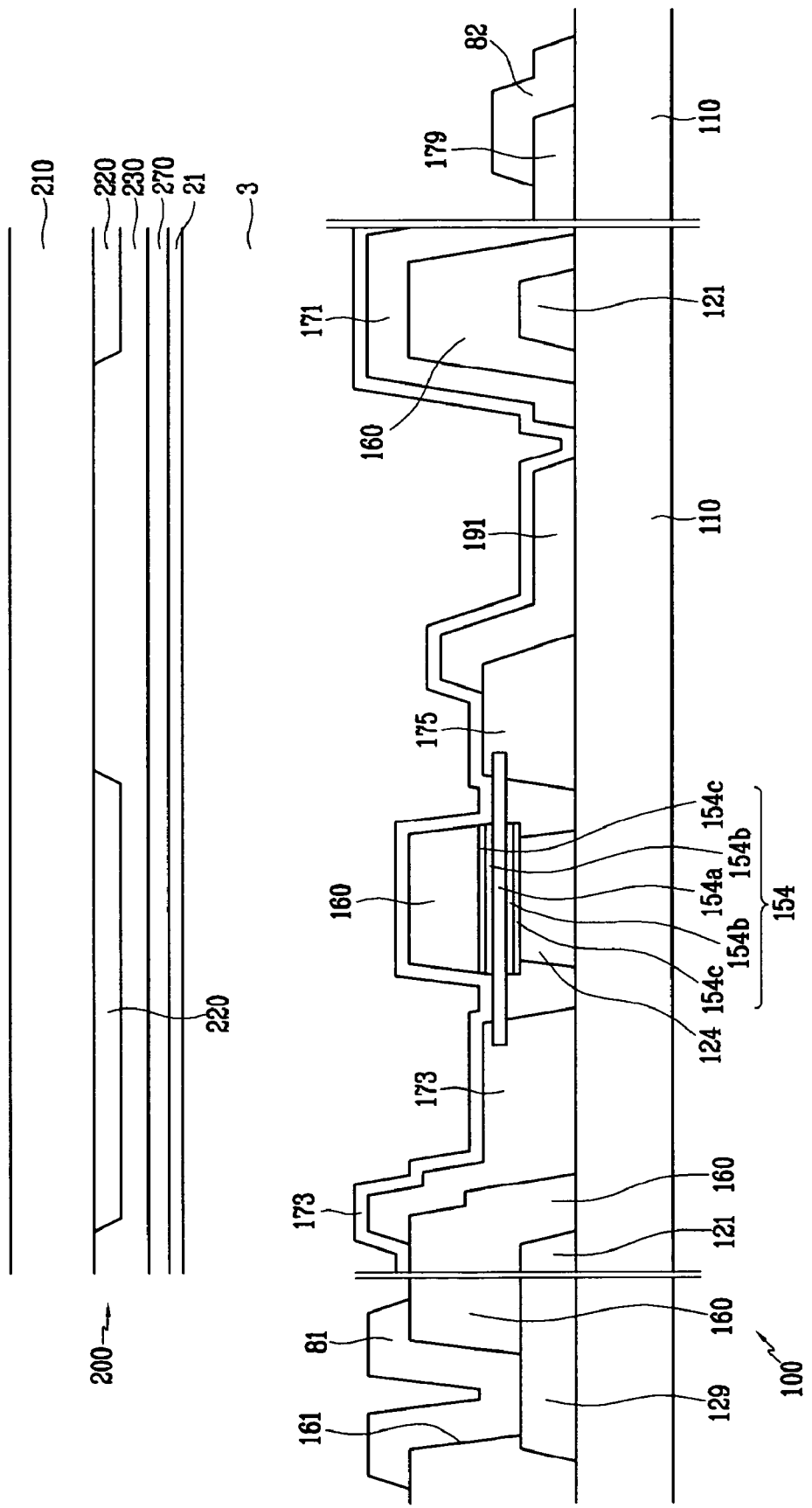
FIG. 15 is a sectional view of an LCD including the wire transistor array panel shown in FIG. 14 taken along line XV-XV.

FIG. 11 is a layout view of a wire transistor array panel according to another embodiment of the present invention. FIG. 12 is an expanded view of a portion of the wire transistor array panel shown in FIG. 1. FIG. 13 is a sectional view of an LCD including the wire transistor array panel shown in FIG. 11 taken along line XIII-XIII. FIG. 14 is a layout view of a wire transistor array panel according to another embodiment of the present invention. FIG. 15 is a sectional view of an LCD including the wire transistor array panel shown in FIG. 14 taken along line XV-XV.

An LCD according to an embodiment includes a wire transistor array panel 100, a common electrode panel 200 facing the wire transistor array panel 100, and a liquid crystal layer 3 interposed between the panels 100 and 200.

Layered structures of the panels 100 and 200 shown in FIGS. 11-15 are substantially the same as those shown in FIGS. 1-4.

Regarding the common electrode panel 200, a light blocking member 220 and a plurality of color filters 230 are formed on an insulating substrate 210. A common electrode 270 is formed on the color filters 230.

Regarding the wire transistor array panel 100, a plurality of gate lines 121 including gate electrodes 124 and end portions 129 are formed on an insulating substrate 110, and a plurality of wires 154 are formed on the gate lines 121.

Referring to FIG. 12, the wires 154 cross over the gate lines 124 and are aligned irregularly. For example, the wires 154 meet each other. The wires 154 may be aligned substantially parallel to each other or may be laminated in a three-dimensional space.

Referring to FIG. 3, each of the wires 154 includes a semiconductor core 154a, an inner cover 154b, and an outer cover 154c.

A plurality of fixers 160 are formed on the wires 154 and the gate lines 121. The fixers 160 fix the wires 154 on the gate lines 121.

The fixers 160 may be made of inorganic insulator such as silicon nitride or silicon oxide, organic insulator, or low dielectric insulator. The dielectric constant of the organic insulator and the low dielectric insulator may be equal to or lower than 4.0. Examples of the low dielectric insulator include a-Si:C:O and a-Si:O:F that may be deposited by plasma enhanced chemical vapor deposition (PECVD). The organic insulator for the fixers 160 may have photosensitivity, and the fixers 160 may have flat surfaces. The fixers 160 may include a lower film of inorganic insulator and an upper film of organic insulator.

Referring to FIGS. 11 and 13, the fixers 160 have a plurality of contact holes 161, 163 and 165. The contact holes 163 and 165 expose exposed portions of the semiconductor cores 154a and the contact holes 161 expose the end portions 129 of the gate lines 121. The boundaries of the contact holes 163 and 165 substantially coincide with the boundaries of the inner covers 154b and the outer covers 154c.

Referring to FIGS. 14 and 15, the fixers 160 extend along the gate lines 121 and have a width greater than a width of the gate lines 121. Both end portions of the semiconductor cores 154a are exposed out of the fixers 160.

A plurality of data lines 171 and a plurality of drain electrodes 175 are formed on the substrate 110 and the fixers 160.

Each data line 171 includes a plurality of source electrodes 173 connected to the semiconductor cores 154a through the contact holes 163 and an end portion 179 having an area for contact with another layer or an external driving circuit. Portions of the boundaries of the source electrodes 173 are disposed within the contact holes 163.

The drain electrodes 175 are separated from the data lines 171 and connected to the semiconductor cores 154a through the contact holes 165. Portions of the boundaries of the drain electrodes 175 are disposed within the contact holes 165.

A gate electrode 124, a source electrode 173, and a drain electrode 175 along with at least one wire 154 form a transistor having a channel formed in the semiconductor core 154a disposed interior to the inner cover 154b of the wires 154.

A plurality of pixel electrodes 191 and a plurality of contact assistants 81 and 82 are formed on the substrate 110.

The contact assistants 81 are connected to the end portions 129 of the gate lines 121 through the contact holes 161, and the contact assistants 82 are connected to the end portions 179 of the data lines 171. The contact assistants 81 and 82 aid adhesion between the end portions 129 and 179 and external devices and protect the end portions 129 and 179.

Alignment layers 11 and 21, that may be homeotropic, are coated on inner surfaces of the panels 100 and 20.

Features of the LCD shown in FIGS. 1-4 may be applicable to the LCD shown in FIGS. 11-15.

A method of manufacturing the wire transistor array panel shown in FIGS. 11-13 according to an embodiment of the present invention will be described in detail with reference to FIGS. 16-21 as well as FIGS. 11-13.

Figure 17:
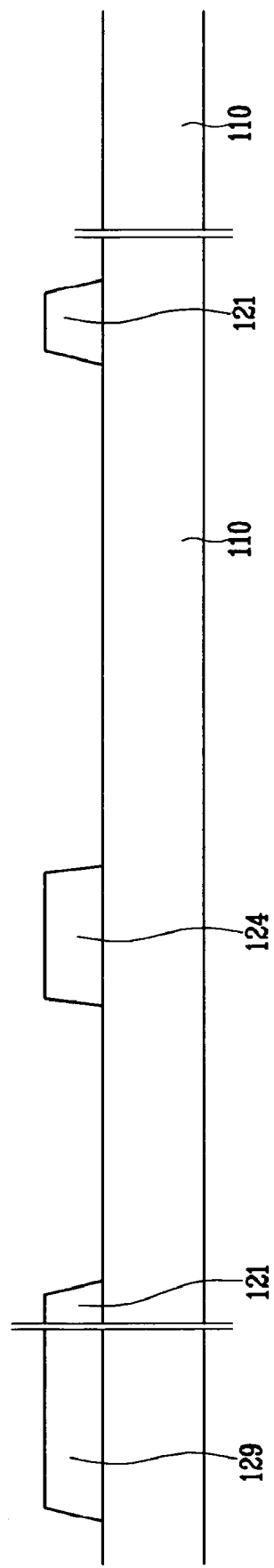
FIG. 17 is a sectional view of the wire transistor array panel shown in FIG. 17 taken along line XVII-XVII.
Figure 19:
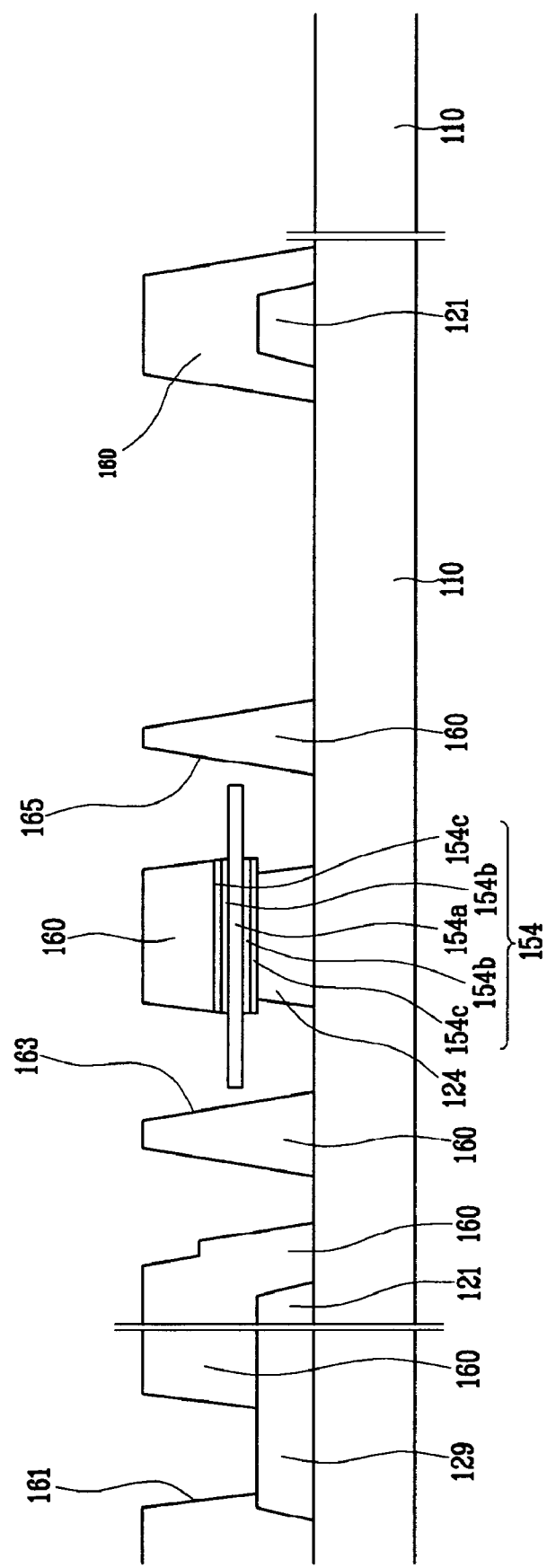
FIG. 19 is a sectional view of the wire transistor array panel shown in FIG. 18 taken along line XIX-XIX.
Figure 20:
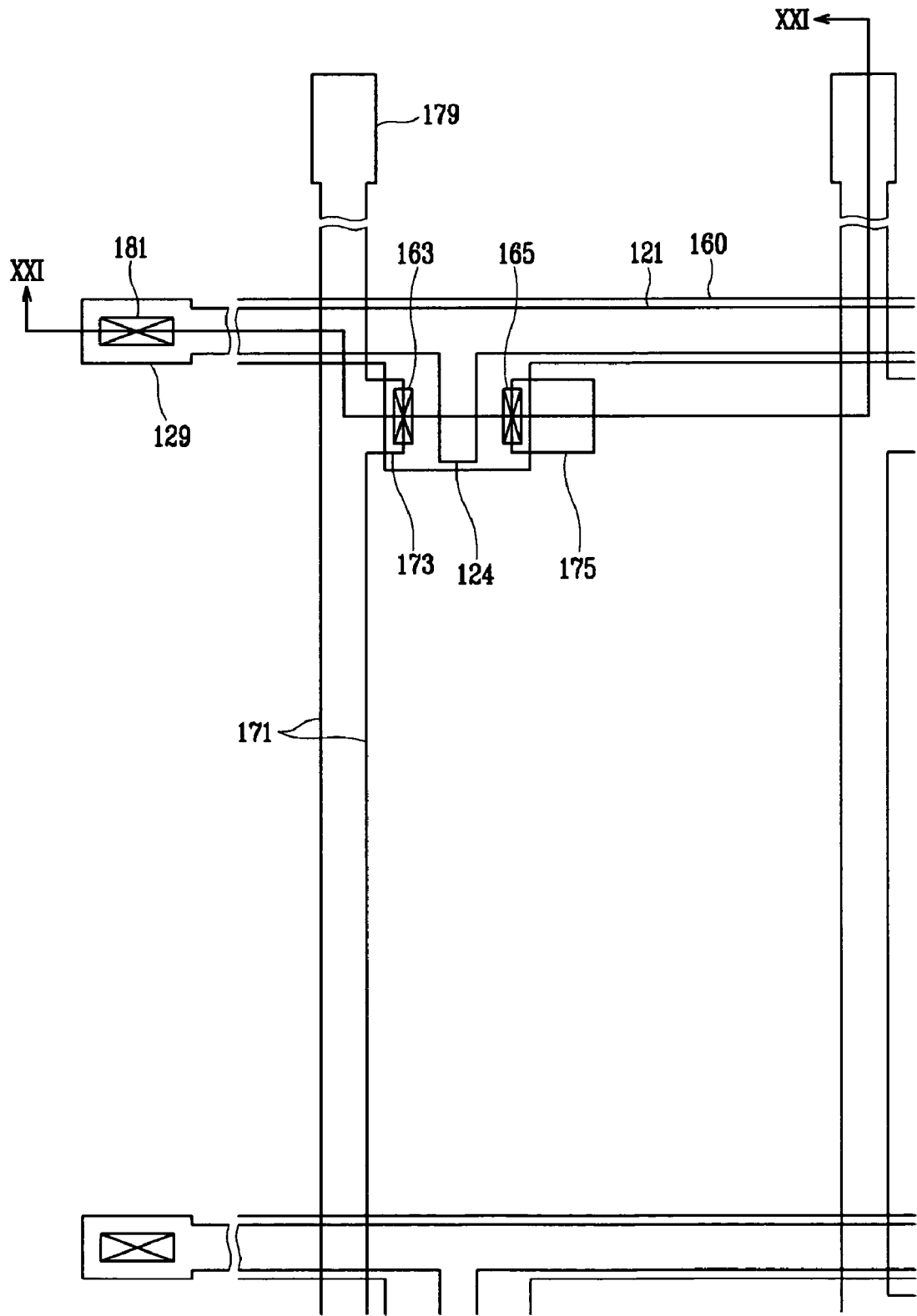
FIG. 20 is a layout view of the wire transistor array panel shown FIGS. 11 and 13 in the step following the step shown in FIG. 18.
Figure 21:
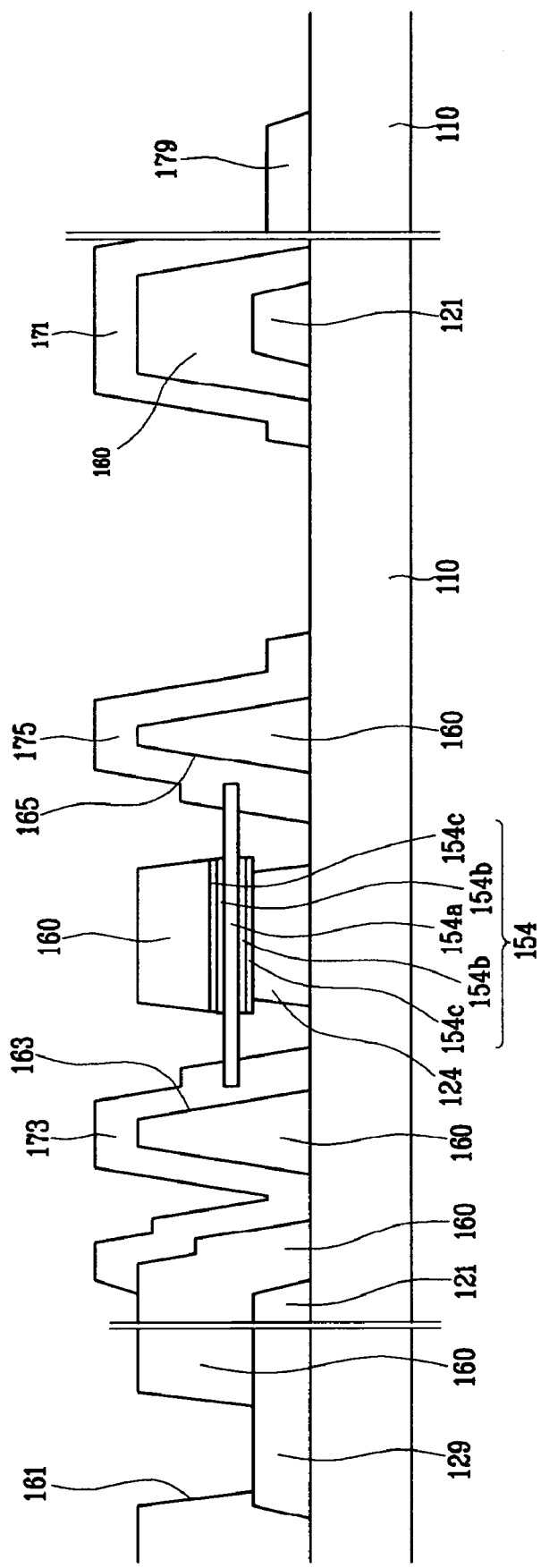
FIG. 21 is a sectional view of the wire transistor array panel shown in FIG. 20 taken along lines XXI-XXI.

FIG. 16 is a layout view of the wire transistor array panel for an LCD shown FIGS. 11 and 13 in an intermediate step of a manufacturing method thereof according to an embodiment of the present invention. FIG. 17 is a sectional view of the wire transistor array panel shown in FIG. 16 taken along line XVII-XVII. FIG. 18 is a layout view of the wire transistor array panel shown FIGS. 11 and 13 in the step following the step shown in FIG. 16. FIG. 19 is a sectional view of the wire transistor array panel shown in FIG. 18 taken along line XIX-XIX. FIG. 20 is a layout view of the wire transistor array panel shown FIGS. 11 and 13 in the step following the step shown in FIG. 18. FIG. 21 is a sectional view of the wire transistor array panel shown in FIG. 20 taken along lines XXI-XXI.

Referring to FIGS. 16 and 17, a conductive layer is deposited on a transparent substrate 110 by sputtering, etc., and patterned by photolithography and etching to form a plurality of gate lines 121 including gate electrodes 124 and end portions 129.

Referring to FIGS. 18 and 19, wires 154 including semiconductor cores 154a covered with inner covers 154b and outer covers 154c are spread. The wires 154 may be put into liquid such as ethanol or photoresist to form a mixture and the mixture may be coated.

An insulating layer is formed on the wires 154 and patterned by photolithography and etching to form a plurality of fixers 160 having contact holes 161, 163 and 165. Some of the wires 154 spaced apart from the gate lines 121 are fully exposed, and others of the wires 154 are partly exposed, being partially covered with the fixers 160.

The fully exposed wires 154 are removed from the substrate 110. Portions of the outer covers 154c and the inner covers 154b of the partly exposed wires 154 are etched to expose portions of the semiconductor core 154a. The outer covers 154c may be wet etched and the inner covers 154b may be dry or wet etched.

Referring to FIGS. 20 and 21, a conductive layer is deposited by sputtering, etc., and patterned by photolithography and etching to form a plurality of data lines 171 and a plurality of drain electrodes 175. The data lines 171 and the drain electrodes 175 are connected to opposite ends of the wires 154 through the contact holes 163 and 165, respectively.

It is preferable that the data lines 171 and the drain electrodes 175 do not contact the conductors 154c of the wires 154 disposed under the gate lines 121.

ITO or IZO is deposited and patterned by photolithography and etching to form a plurality of pixel electrodes 191 and a plurality of contact assistants 81 and 82 as shown in FIGS. 11 and 13.

The above-described transistor may be employed in, for example, an organic light emitting diode (OLED) display.

The OLED display includes a plurality of signal lines (not shown) and a plurality of pixels (not shown) coupled to the signal lines and arranged in a matrix. Each pixel includes an organic light emitting element, a driving transistor, and a switching transistor.

Each of the driving transistor and the switching transistor includes wires, a control terminal, an input terminal, and an output terminal. Each of the wires includes a signal-crystalline semiconductor core, an inner cover enclosing a middle portion of the semiconductor core, and an outer cover enclosing the inner cover as shown in FIG. 3. The control terminal overlaps the outer covers of the wires, and the control terminal and the input terminal are connected to the semiconductor cores.

The output terminal of the switching transistor is connected to the control terminal of the driving transistor, and the output terminal of the driving transistor is connected to the organic light emitting element. The organic light emitting element emits light with an intensity according to the output current of the driving transistor.

Although preferred embodiments of the present invention have been described in detail hereinabove, it should be clearly understood that many variations and/or modifications of the basic inventive concepts herein taught which may appear to those skilled in the present art will still fall within the spirit and scope of the present invention.

What is claimed is:

1. A transistor comprising:
    a wire formed on a substrate, the wire comprising a semiconductor core, a first cover enclosing a portion of the semiconductor core, and a second cover enclosing the first cover;

a first electrode formed on the second cover of the wire;

an insulating layer formed on the first electrode and having contact holes exposing both portions of the semiconductor core and portions of the substrate; and a second electrode and a third electrode connected to the wire through the contact holes.

2. The transistor of claim 1, wherein the insulating layer comprises organic material.

3. The transistor of claim 2, wherein the insulating layer comprises acrylic copolymer.

4. The transistor of claim 1, wherein the first cover comprises an insulator.

5. The transistor of claim 4, wherein the first cover comprises silicon oxide or silicon nitride.

6. The transistor of claim 1, wherein the second cover comprises a conductor.

7. The transistor of claim 6, wherein the second cover comprises at least one of Al, Cr, Mo, Cu, Ti, and Ta.

8. The transistor of claim 1, wherein the first electrode and the first and the second covers have substantially coinciding boundaries.

9. A display device comprising:

a substrate;

a wire formed on a substrate, the wire comprising a semiconductor core, an inner cover enclosing a portion of the semiconductor core, and an outer cover enclosing the inner cover;

a first electrode formed on the outer cover of the wire;

an insulating layer formed on the first electrode and having contact holes exposing both portions of the semiconductor core and portions of the substrate; and a second electrode and a third electrode connected to the wire through the contact holes; and a pixel electrode connected to the third electrode.

10. The display device of claim 9, the display device further comprising:

a common electrode facing the pixel electrode; and a liquid crystal layer disposed between the pixel electrode and the common electrode.

11. A transistor comprising:

a first electrode, a second electrode, and a third electrode formed on a substrate;

a wire formed on the first electrode, the wire comprising a semiconductor core, a first cover enclosing the semiconductor core, and a second cover enclosing the first cover; and a fixer formed on the first electrode and the wire, wherein portions of the semiconductor core are not covered with the fixer, and the portions are connected to the second and the third electrodes, respectively, wherein the semiconductor core of the wire passes through the second electrode and the third electrode.

12. The transistor of claim 11, wherein the portions of the semiconductor core are opposite end portions that are not covered with the fixer.

13. The transistor of claim 11, wherein at least one portion of the second and the third electrodes are disposed on the fixer.

14. The transistor of claim 11, wherein the second and the third electrodes have boundaries contacting the semiconductor core.

15. The transistor of claim 11, wherein the first cover comprises an insulator.

16. The transistor of claim 15, wherein the first cover comprises silicon oxide or silicon nitride.

17. The transistor of claim 11, wherein the second cover comprises a conductor.

18. The transistor of claim 17, wherein the second cover comprises at least one of Al, Cr, Mo, Cu, Ti, and Ta.

19. The transistor of claim 11, disposed in a display device comprising a pixel electrode connected to the third electrode.

20. The transistor of claim 19, the display device further comprising:

a common electrode facing the pixel electrode; and a liquid crystal layer disposed between the pixel electrode and the common electrode.

* * * * *